United States Patent

[11] 3,571,719

[72] Inventors Gene Beary
Franklin Park;
Kamil Y. Jabbar, River Grove, Ill.

[21] Appl. No. 784,046
[22] Filed Dec. 13, 1968
[45] Patented Mar. 23, 1971
[73] Assignee Motorola, Inc.
Franklin Park, Ill.

[54] OVERLOAD COMPENSATION CIRCUIT FOR ANTENNA TUNING SYSTEM
6 Claims, 2 Drawing Figs.

[52] U.S. Cl. 325/383, 325/380, 325/408
[51] Int. Cl. H04b 1/18
[50] Field of Search 325/452, 454, 468, 469, 373, 383, 319, 380, 408, 405, 412, 413, 376, 384, 387; 334/11, 14, 15

[56] References Cited

UNITED STATES PATENTS

| | | | |
|---|---|---|---|
| 2,243,423 | 5/1941 | Hollingsworth | 325/384 |
| 3,002,090 | 9/1961 | Hirsch | 325/413X |
| 3,192,316 | 6/1965 | Humphrey | 325/405X |
| 3,204,207 | 8/1965 | Denker | 334/15 |
| 3,440,544 | 4/1969 | Pampel | 334/15UX |

*Primary Examiner*—Robert L. Griffin
*Assistant Examiner*—R. S. Bell
*Attorney*—Mueller and Aichele

ABSTRACT: In an antenna tuning system using a voltage variable capacitor diode in the tank circuit for tuning, the antenna is provided with an overload compensation circuit for the capacitor diode in the form of a variable shunt impedance connected between the antenna and ground. The variable impedance is in the form of a transistor or a field effect transistor, the conduction of which is controlled by the AGC voltage in the radio receiver supplied with signals from the antenna tuning circuit. As the AGC signal increases, the impedance of the transistor decreases to shunt increasing amounts of the signal supplied by the antenna to ground. This limits the signal level across the voltage variable capacitor to prevent rectification of high level signals thereby.

PATENTED MAR 23 1971 3,571,719

Inventors
GENE BEARY
KAMIL Y. JABBAR
BY
Mueller, Aichele & Rauner
ATTYS.

OVERLOAD COMPENSATION CIRCUIT FOR ANTENNA TUNING SYSTEM

BACKGROUND OF THE INVENTION

The use of voltage variable semiconductor diode capacitors for electronically tuning radio receivers has provided receiver designers with a wide latitude of design possibilities in the configurations which may be made in radio receivers. This is especially desirable in the use of radio receivers for vehicular applications where it is desirable to provide means for remotely tuning the radio receiver from one or more locations within the vehicle. The use of tuning circuits including voltage variable diode capacitors has some disadvantages, however, especially when high level RF signals from strong stations are applied to the tuning circuit. Since the diode capacitor is a voltage controlled device, the characteristics of the diode capacitor respond to the level of the RF signals applied across it. When strong signals are applied across the diode capacitor, partial rectification of the signal by the diode capacitor occurs, causing a change in the DC bias on the diode. This results in degradation of the circuit operation due to changes in the capacitance value of the reverse-biased diode capacitor, and detuning of the circuit occurs.

This problem is especially in the antenna stage, so that it is desirable to provide some means of preventing high signal levels from being applied across the voltage a variable tuning capacitor used for tuning the antenna state of the receiver.

SUMMARY OF THE INVENTION

It is an object of this invention to provide an overload compensation circuit for the voltage variable capacitor used in an antenna turning circuit.

It is an additional object of this invention to provide a variable impedance shunt for shunting the antenna to prevent overloading of the voltage variable capacitor used in an antenna tuning circuit.

An overload compensation circuit for a voltage variable reactance used in the tuning circuits of an antenna includes a variable impedance shunting means for shunting the antenna input, with the impedance of the variable impedance shunting means being controlled in response to the level of the RF signal supplied by the antenna.

DETAILED DESCRIPTION

Figure 1:
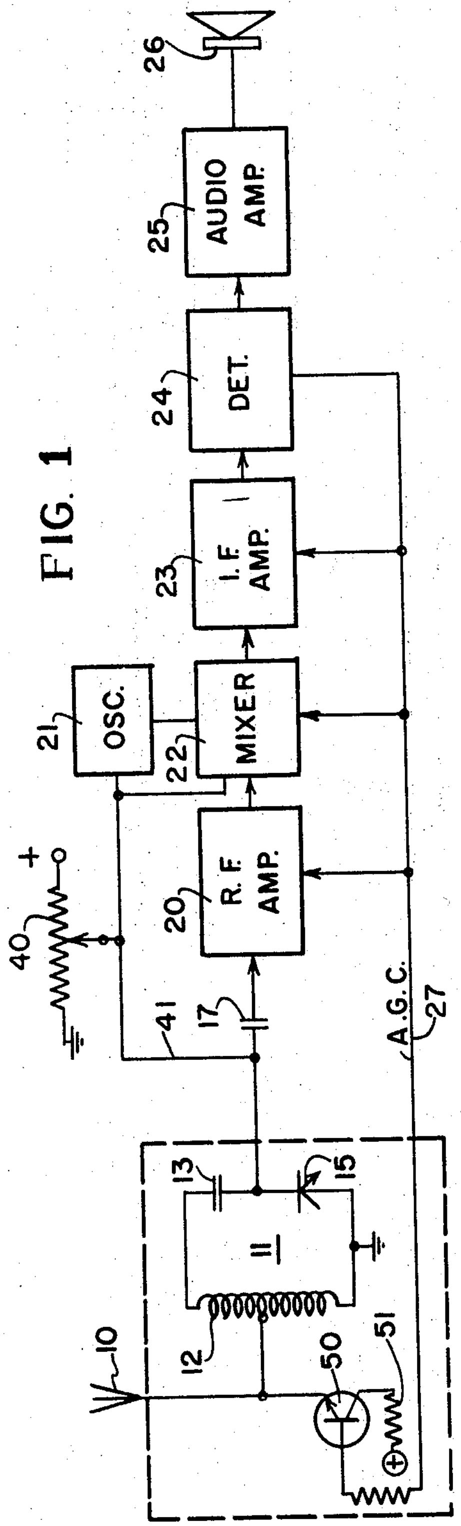
FIG. 1 shows a schematic wiring diagram, partially in block form, illustrating a preferred embodiment of the invention.

Referring now to FIG. 1 of the drawing there is illustrated a radio receiver having an electronically tuned antenna. The receiver shown in FIG. 1 includes an antenna 10 which is coupled to a tuning circuit 11 consisting of an inductive coil 12 having a blocking capacitor 13 and a voltage variable diode capacitor 15 connected in series thereacross. The voltage variable capacitor or reactance device 15 and the coil 12 form a tank circuit for tuning the antenna 10 through a predetermined radio frequency range. The voltage variable capacitor 15 is a two-terminal PN junction semiconductor device which exhibits a change in capacitance proportional to a change in direct current bias applied in the reverse direction across the device. An increase in the reverse bias causing a decrease in capacitance and vice versa.

Selected radio frequency signals are supplied through a coupling capacitor 17 to the radio receiver Rf amplifier stage 20 which amplifies the signals obtained from the antenna 10. Following amplification, the radio frequency signals are heterodyned in a converter comprising a local oscillator 21 and a mixer 22. The resultant intermediate frequency signals are amplified in an IF amplifier stage 23 and are detected in a detector stage 24 which is coupled to an audio amplifier 25 which drives a speaker 26. An automatic gain control signal may be derived from a detector stage 24 of the radio receiver and is applied over a lead 27 in a conventional manner to provide automatic gain control for the RF amplifier 20, the mixer 22 and the IF amplifier 23.

In addition to using a voltage variable capacitor device for tuning the antenna system, the receiver shown in FIG. 1 utilizes similar devices for tuning other tuned circuits in the receiver, such as the oscillator 21. These voltage variable capacitor devices for tuning provide many advantages over conventional mechanical tuners such as size and reliability. A potentiometer 40, which may be located at the radio receiver or at other remote locations, provides a direct current biasing potential for tuning the voltage variable capacitors derived from the tap of the potentiometer 40 for tuning the voltage variable capacitor 15 in the antenna circuit is applied over a lead 41 to the junction between the voltage variable capacitor 15 and the capacitors 13 and 17. The manner in which this potential effects tuning of the tank circuit 11 is well known.

The circuit described thus far operates satisfactorily for RF wave signals obtained from the antenna 10 at a signal level falling below a predetermined magnitude or amount. In the event however, that the RF signal level increases to a point such that the voltage variable capacitor diode 15 is provided with high level voltages thereacross which are in excess of the biasing voltage applied over the lead 41, the voltage variable capacitor diode 15 tends to commence partial rectification of the signals applied thereacross, and this results in a change in its capacitance, with subsequent detuning and degradation of performance of the entire receiver.

In order to prevent such degradation of performance, the circuit shown in FIG. 1 is provided with an additional variable resistive impedance shunt in the form of an NPN transistor 50 connected between the junction of the antenna 10 and the coil 12 of the tank circuit 11 through a small resistance 51 to RF ground ($B+$). The conduction of the transistor 50 is controlled by the automatic gain control signal obtained from the output of the detector stage 24 over the lead 27 which is connected to the base of the transistor 50 through a resistor 52.

At low input signal levels, below the point where rectification of the signals by the voltage variable capacitor 15 may occur, the AGC voltage applied to the base of the transistor 50 is insufficient to drive the transistor 50 into conduction; so that the transistor 50, in effect, acts as an open switch and has no effect on the operation of the circuit. If, however, the input signal level rises to such a point that the AGC signal obtained from the detector becomes sufficient to drive the transistor 50 into conduction, the transistor 50 commences conduction and inserts a finite impedance between the antenna 10 and RF ground. As the signal level obtained from the antenna 10 continues to increase, the transistor 50 is rendered increasingly conductive thereby causing an increasingly reduced impedance to be connected between the antenna and RF ground. If the input signal level should rise to such a point that the transistor 50 were driven into saturation, the impedance connected between the antenna 10 and RF ground would equal approximately the resistance of the resistor 51 which is of relatively small valve.

The shunting of the signals by the variable impedance transistor 50 prevents the signals applied across the voltage variable capacitor 15 from rising to a level sufficient to cause the capacitor 15 to act as a rectifier in the circuit; so that the circuit continues to operate properly, even in the presence of high RF signal inputs. Whenever the RF signal input drops to a normal level, the conduction of the transistor 50 correspondingly drops thereby raising the in impedance of the shunt circuit connected between the antenna and RF ground; so that a continuous control of the value of the shunt impedance which loads the antenna is effected.

Figure 2:
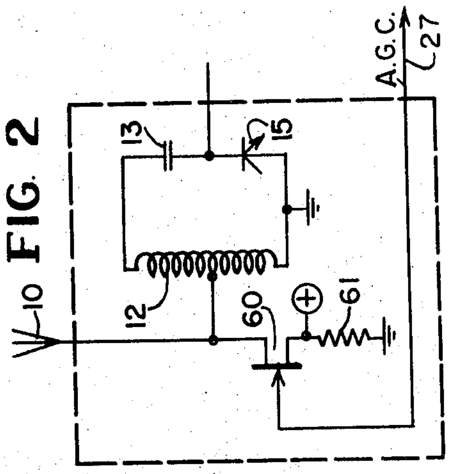
FIG. 2 is a partial schematic wiring diagram illustrating a second embodiment of the circuit shown in FIG. 1.

Referring now to FIG. 2, there is shown a partial schematic diagram, with the portion enclosed in dotted lines being substituted for the portion of the circuit shown in FIG. 1 which is enclosed in dotted lines. In FIG. 2 an N-channel field-effect transistor 60 has been substituted for the NPN transistor 50, with the AGC control signals applied over the lead 27 being coupled to the gate of the field effect transistor 60, the drain of which is connected to the antenna 10 at the junction of the antenna with the coil 12, and with the source of the transistor 60 being supplied with a positive biasing and being connected through a small resistance 61 to ground.

The circuit shown in FIG. 2 operates in a manner similar to the circuit shown in FIG. 1 but has an additional advantage over the use of the NPN transistor shown in FIG. 1 in that the NPN transistor does not operate as a truly linear impedance as its conductivity is changed in response to the AGC voltage applied over the lead 27. The circuit shown in FIG. 1 provides adequate compensation for the voltage variable capacitor 15, but it is desirable to provide a linear compensation for optimum results. Since field effect transistors exhibit a linear change in resistance over a variation in gate to source voltage from $V_{gs}=0$ to $V_{gs}=V_p$ (the pinch-off voltage) of the transistor, it is possible to provide for the desired linearity which is not obtained with the transistor 50 of FIG. 1.

In the embodiment shown in FIG. 2, for low signal levels, the AGC voltage applied on the lead 27 to the gate of the transistor 60 is low; so that the circuit including the transistor 60 acts as an open switch and does not affect the operation of the remainder of the radio receiver. As the AGC voltage on the lead 27 increases to a more positive value, the transistor 60 presents initially a relatively high finite impedance between the antenna 1—0 and ground. As the RF signal levels further increase, causing a further increase in the AGC voltage applied to the gate of the transistor 60, the transistor 60 exhibits a linearly decreasing impedance connected between the antenna and ground, until a point is reached at which the impedance between the antenna 10 and ground equals that of the relatively small resistor 61, providing a maximum shunt between the antenna and ground. Whenever the RF signal level decreases, the foregoing sequence is reversed, with the impedance of the transistor 60 increasing to a point where the circuit operates once again as if the transistor 60 and the circuit operates once again as if the transistor 60 and the circuit connected in series with it were not in the system. Thus, the circuit shown in FIG. 2 provides a continuously variable linear impedance in response to different levels of RF input signals obtained from the antenna 10.

It should be noted that although the control of the gate of the transistor 60 and the base of the transistor 50 is shown as being derived from the AGC output of the detector 24, this control voltage may be derived from any point in the radio receiver which varies as a function of the input signal strength. It also should be noted that the tuning circuit 11 using the voltage variable capacitor diode may be either a series or a parallel tuned circuit since the overload compensation or protection circuit will function equally as well irrespective of the type of tuning circuit which is being utilized.

We claim:

1. An antenna system for wave signal apparatus having an antenna and antenna tuning circuit means electrically connected to said antenna, said tuning circuit means including voltage variable reactance means, circuit means connected to said voltage variable reactance means for applying a variable bias potential thereto to selectively tune said antenna tuning circuit means to a predetermined frequency, said antenna system provided with an overload compensation circuit means including in combination, variable resistive impedance means shunting said antenna; and controlling means for changing the impedance of the variable resistive impedance means in response to the level of signals applied by said antenna to said tuning circuit means.

2. An overload compensation circuit according to claim 1 wherein the variable resistive impedance means includes a normally nonconductive transistor means rendered increasingly conductive by the controlling means in response to increasing signal levels of the RF signal.

3. An overload compensation circuit in accordance with claim 1 wherein the antenna system is coupled to a radio receiver having means for providing an automatic gain control signal and wherein said controlling means is responsive to the automatic gain control signal obtained from the radio receiver.

4. An overload compensation circuit according to claim 2 wherein the antenna system is coupled to a radio receiver having means for providing an automatic gain control signal and wherein said controlling means is responsive to the automatic gain control signal obtained from the radio receiver.

5. An overload compensation circuit in accordance with claim 1 wherein the variable resistive impedance means includes a field-effect transistor rendered increasingly conductive to present a decreasing impedance in response to increased signal levels of the RF signal.

6. An overload compensation circuit according to claim 5 further including a radio receiver coupled to said antenna system, said radio receiver including means for providing an automatic gain control signal in response to the signals applied thereto and wherein the controlling means is responsive to the automatic gain control signal for applying varying bias potentials to the field effect transistor to render the field-effect transistor increasingly conductive, thereby decreasing the resistance thereof in response to increased automatic gain control signal levels to reduce the effective impedance of the variable impedance shunting means.